(12) United States Patent
Hoggan et al.

(10) Patent No.: US 6,229,377 B1
(45) Date of Patent: May 8, 2001

(54) DUAL AMPLITUDE PULSE GENERATOR FOR RADIATION DETECTORS

(75) Inventors: Jerry M. Hoggan, Idaho Falls; Ronnie L. Kynaston, Blackfoot; Larry O. Johnson, Island Park, all of ID (US)

(73) Assignee: Bechtel BWXT Idaho, LLC, Idaho Falls, ID (US)

( * ) Notice: Subject to any disclaimer, the term of this patent is extended or adjusted under 35 U.S.C. 154(b) by 0 days.

(21) Appl. No.: 09/337,979

(22) Filed: Jun. 22, 1999

(51) Int. Cl.[7] .................................................... H03K 17/62
(52) U.S. Cl. .......................... 327/411; 327/408; 327/514
(58) Field of Search .................................. 327/407, 408, 327/298, 409, 410, 411, 412, 413, 514

(56) References Cited

U.S. PATENT DOCUMENTS

| 4,968,889 | | 11/1990 | Hartwell et al. | 250/336.1 |
|---|---|---|---|---|
| 5,745,003 | * | 4/1998 | Wakimoto et al. | 327/382 |
| 5,767,730 | * | 6/1998 | Hagino | 327/407 |
| 5,777,505 | * | 7/1998 | LaRue | 327/407 |

OTHER PUBLICATIONS

"Measurements and Signal Processing," *The Art of Electonic*, pp. 608–611.

Gehrke, R. J., et al, "A portable, photon analysis spectrometer for the assay of X– and gamma–ray emitting radionuclides," *Journal of Radioanalytical and Nuclear Chemistry*, vol. 233, Nos. 1–2 (1998) pp. 225–231.

\* cited by examiner

*Primary Examiner*—Toan Tran
*Assistant Examiner*—Linh Nguyen
(74) *Attorney, Agent, or Firm*—Klaas Law W'Meara & Malkin

(57) ABSTRACT

A pulsing circuit for producing an output signal having a high amplitude pulse and a low amplitude pulse may comprise a current source for providing a high current signal and a low current signal. A gate circuit connected to the current source includes a trigger signal input that is responsive to a first trigger signal and a second trigger signal. The first trigger signal causes the gate circuit to connect the high current signal to a pulse output terminal whereas the second trigger signal causes the gate circuit to connect the low current signal to the pulse output terminal.

13 Claims, 4 Drawing Sheets

DUAL AMPLITUDE PULSE GENERATOR FOR RADIATION DETECTORS

CONTRACTUAL ORIGIN OF THE INVENTION

The United States Government has rights in this invention pursuant to Contract No. DE-AC07-94ID13223 between the United States Department of Energy and Lockheed Martin Idaho Technologies Company.

FIELD OF INVENTION

This invention relates to pulse generators in general and more specifically to pulse generator circuits for use with gas and solid state ionizing radiation detectors.

BACKGROUND OF THE INVENTION

Radiation detectors for detecting high energy photons (e.g., gamma rays and x-rays) are well-known in the art and are used to detect high energy photons produced by any of a wide range of radioactive or other types of samples. The detection, identification, and spectroscopy of such energetic photons comprises an integral part of the fields of nuclear and particle physics as well as several fields that make use of radioactivity, including, for example, medicine, forensic science, and industrial inspection applications. Radiation detectors are also used at nuclear power plants and laboratories to monitor and study radiation levels.

This invention is particularly suited for use with two types of ionizing radiation detectors. The first type, referred to herein as "gas tube" or simply "gas" detectors utilize a gas-filled chamber or tube which contains a positively charged wire. When a high energy photon enters the chamber it may ionize a gas atom, causing it to release an electron or electrons in the process. The liberated electron or electrons may in turn ionize additional gas atoms, which liberate yet more electrons. The liberated electrons are collected by the positively charged wire. A detection circuit connected to the wire measures the charge delivered to the wire by the electrons. Generally speaking, the higher the energy of the incoming photon, the more atoms are ionized and the more electrons are liberated. Therefore, the magnitude of the detected charge is related to the amount of energy lost by the incoming photon inside the detector. If the photon loses all of its energy in the detector, the magnitude of the detected charge is proportional to the photon energy.

Solid state detectors are similar to gas detectors except that the active volume (i.e., the gas) is replaced by a semiconducting material such as germanium. Accordingly, both types of detectors have in common the property that they use the energy of the incoming photon to ionize an atom of some material. Generally speaking, solid state detectors provide superior sensitivity and resolution compared with gas tube detectors, although both types remain in use. A major difference between gas and solid state detectors is that gas detectors generally multiply the liberated charge, while solid state detectors generally do not.

Regardless of the type of radiation detector that is used in a given application, spectrometric measurements (i.e., the measurement of the energy distribution of the incoming photons) may be complicated by factors such as "pile-up" and "dead time." Pile-up may occur when two separate photons enter the detector at approximately the same instant, in which case the total charge (i.e., ionization or pair production) may be greater than the charge that would be produced by either of the photons alone. Dead time refers to those periods in which a signal processing system (which may include an analog-to-digital converter) associated with the detector is processing a signal (e.g., a pulse) resulting from a photon. The signal processing system may be unable to accept or process additional signals or pulses produced by subsequent photons during this processing or "dead" time, resulting in a loss of such additional signals. Fortunately, however, systems and methods have been developed that compensate for factors such as pile-up and dead time.

One system and method that may be used to correct for pile-up and dead time utilizes a pulse generator circuit to inject a plurality of pulses into the test input of the detector pre-amplifier. Since the frequency and amplitude of the injected pulses are known, the signal processing system associated with the detector amplifier may identify certain of the data signals received from the detector amplifier as those produced by the pulse generator. Since the number and timing of the injected pulses from the pulse generator are known, the fraction of data lost due to pile-up and dead time can be calculated. A correction factor may then be used to correct for lost data. Also, since the pulses from the pulse generator are very stable in amplitude over time, they can be used to provide a calibrated energy scale for each acquired spectrum. (This is particularly applicable with solid state detectors.) Because the pulses produced by the pulse generator may be separated from detector pulses, they may be used to detect slight changes in the gain or zero of the energy scale before they are observed otherwise.

While such pulse injection systems are useful in improving the performance of radiation detectors, they are not without their problems and disadvantages. For example, one problem with the pulse injection method is that care must be exercised to ensure that the injected signals are positioned in an uncluttered or unused spectral region. This is especially difficult if the pulse generator provides pulses having both high and low amplitudes. This difficulty generally limits detectors having dual amplitude pulse injection systems to applications in which the spectrum of the source is known or has been previously determined.

A system and method which solves the foregoing difficulty is described in U.S. Pat. No. 4,968,889, entitled "Pulser Injection with Subsequent Removal for Gamma-Ray Spectroscopy," which is incorporated herein by reference for all that it discloses. Briefly, this patent discloses a pulser control and separation logic module which controls the injection of the pulses and includes separation logic which enables the injected pulses to be stored in a region of the multichannel analyzer that is separate from the region reserved for the storage of x-ray and gamma ray events. While the system and method described in the foregoing patent provides improved compensation for pile-up, dead-time, gain, and zero point shifts, it is not particularly well-suited for portable applications wherein the power available to operate the detector and pulse generator circuits is limited (e.g., batteries). Another problem associated with portable applications is that the detector and pulse generator circuits are often subjected to substantial temperature fluctuations and other environmental factors which can adversely affect the accuracy and stability of the injected pulses.

Consequently, a need remains for a pulse generator having reduced energy consumption while at the same time providing increased pulse accuracy and stability over a wide range of temperatures and environmental conditions.

SUMMARY OF THE INVENTION

A pulsing circuit for producing an output signal having a high amplitude pulse and a low amplitude pulse may comprise a current source for providing a high current signal and a low current signal. A gate circuit connected to the current source includes a trigger signal input that is responsive to a first trigger signal and a second trigger signal. The first trigger signal causes the gate circuit to connect the high current signal to a pulse output terminal whereas the second trigger signal causes the gate circuit to connect the low current signal to the pulse output terminal.

BRIEF DESCRIPTION OF THE DRAWING

Illustrative and presently preferred embodiments of the invention are shown in the accompanying drawing in which.

DETAILED DESCRIPTION OF THE INVENTION

Figure 1:
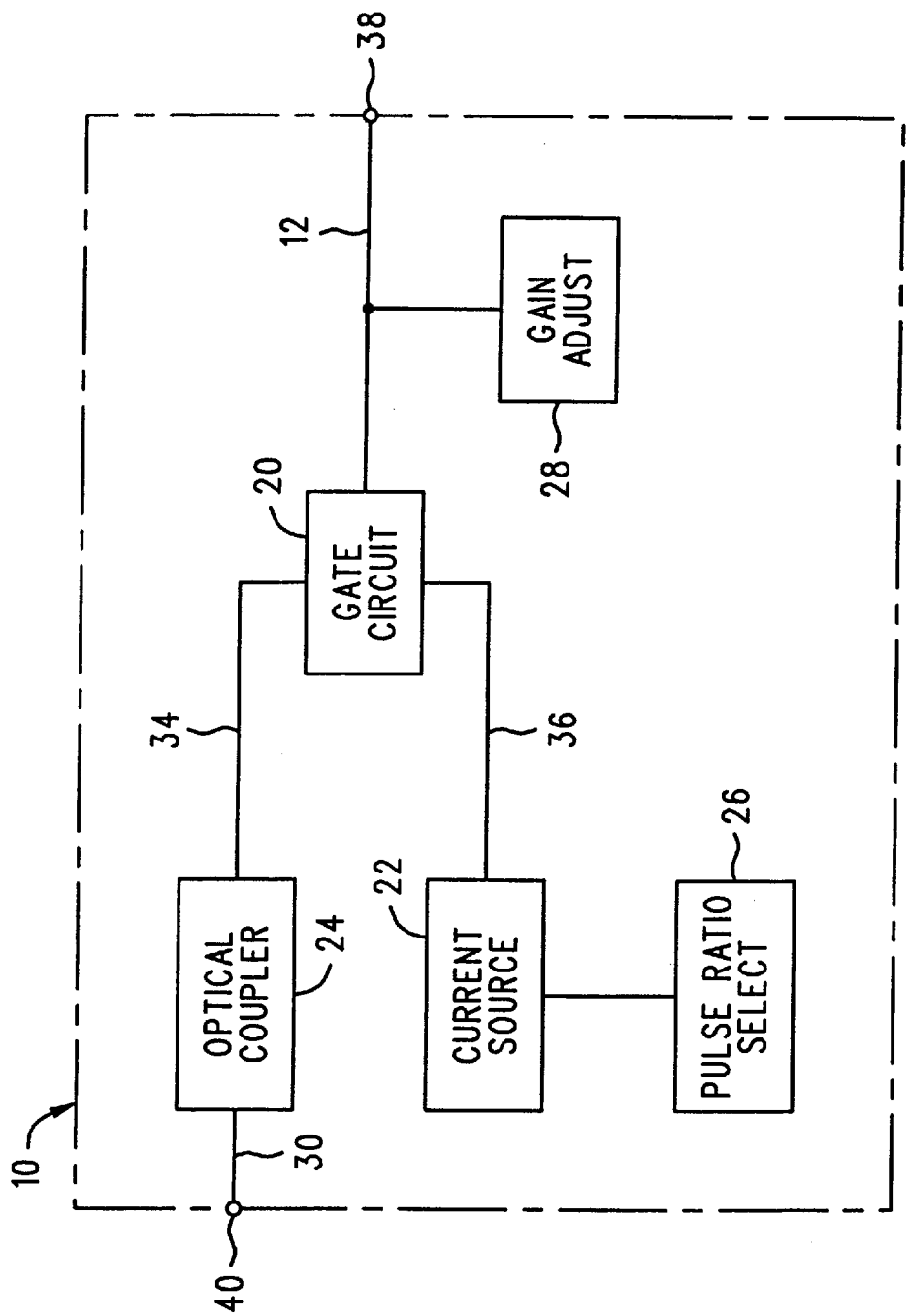
FIG. 1 is a block diagram of a dual amplitude pulse generator according to the present invention.

A dual amplitude pulse generator 10 according to the present invention is shown in FIG. 1 as it may be used to produce a dual amplitude output signal 12 comprising alternating high and low amplitude pulses 14 and 16. See FIG. 2. The dual amplitude pulse generator 10 may be connected to a radiation detector system 18 shown in FIG. 3 so that the dual amplitude output signal 12 may be used in compensating for pile-up and in detecting excess noise and zero/gain shifts. By way of example, in one preferred embodiment the radiation detector system 18 may comprise a radiation detector system of the type shown and described in U.S. Pat. No. 4,968,889, which is incorporated herein by reference for all that it discloses. Alternatively, the dual amplitude pulse generator 10 may be used with other types of detectors or in other applications, as will be described in greater detail below.

Regardless of the particular application, the dual amplitude pulse generator 10 may comprise a gate circuit 20, a current source 22, and, an optical coupler 24. The pulse generator 10 may also include a pulse ratio selection circuit 26 and a gain adjustment circuit 28 to adjust the ratio of the magnitudes of the high and low amplitude pulses 14 and 16 and to adjust the overall amplitude of the output signal 12, but without changing the amplitude ratio of the high and low pulses 14 and 16.

Figure 3:
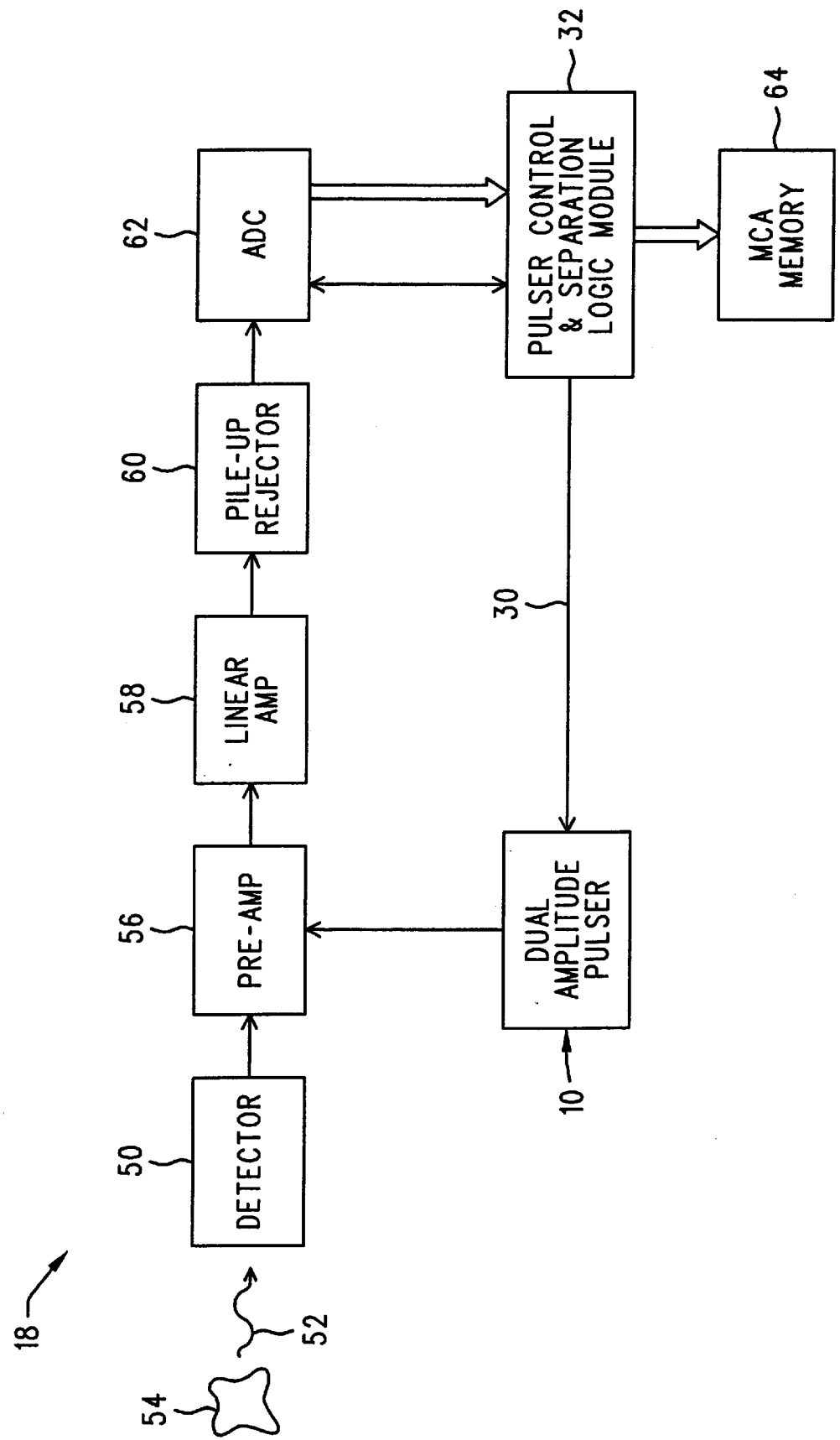
FIG. 3 is a block diagram of a radiation detector system that includes the dual amplitude pulse generator shown in FIG. 1.
Figure 4:
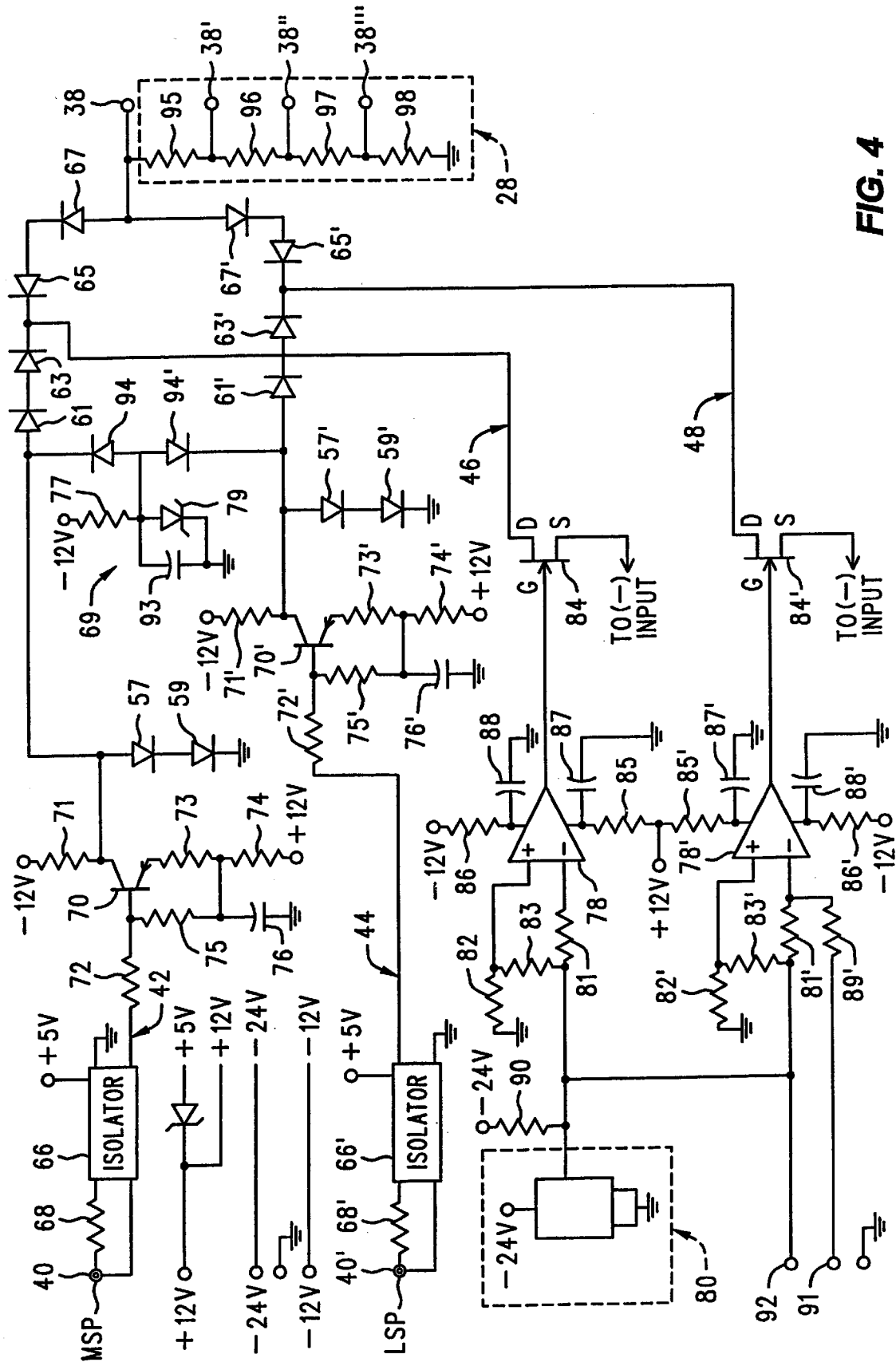
FIG. 4 is a detailed electrical schematic of the dual amplitude pulse generator shown in FIG. 1.

Referring now primarily to FIG. 1, with occasional reference to FIGS. 3 and 4, the optical coupler 24 may be connected to an input terminal 40 and receives an input signal 30 from an external source, e.g., from a pulser control and separation logic module 32 (FIG. 3). Optical coupler 24 produces a trigger signal 34 which is used to control the gate circuit 20. In one preferred embodiment, the trigger signal 34 comprises a first trigger signal 42 and a second trigger signal 44 (FIG. 4). The current source 22 produces an output current signal 36 that, in one embodiment, comprises a high current signal 46 and a low current signal 48 (FIG. 4). The high and low current signals 46 and 48 produced by the current source 22 are selectively applied to the output terminal 38 by the gate circuit 20 in response to the first and second trigger signals 42 and 44. Accordingly, the high and low current signals 46 and 48 produce the high and low amplitude pulses 14 and 16, respectively, of dual amplitude output signal 12.

A pulse ratio selection circuit 26 may be associated with the current source 22 and is used to vary the ratio of the magnitudes 11 and 13 of the high and low amplitude pulses 14 and 16, respectively. See FIG. 2. For example, in one preferred embodiment, the pulse ratio selection circuit 26 may be used to change the ratio of the high amplitude pulse 14 to the low amplitude pulse 16 from a ratio of about 10:1 to a ratio of about 50:1. A gain adjustment circuit 28 may be provided to adjust the overall magnitude of the dual amplitude output signal 12, but without affecting the pulse ratio.

The dual amplitude pulse generator 10 may be operated as follows to produce a dual amplitude output signal 12 comprising alternating high and low amplitude pulses 14 and 16. Consider, for example, an application wherein the dual amplitude pulse generator 10 is connected to a radiation detector system 18, such as the type shown in FIG. 3 and disclosed in detail in U.S. Pat. No. 4,968,889. Briefly, such a radiation detector system 18 may comprise a detector 50 responsive to a high energy photon 52 (e.g., a gamma ray or an x-ray) from a source 54. The detector 50 produces an output signal which is converted by a pre-amplifier 56 to a proportional voltage signal which is then fed into a linear amplifier 58. The linear amplifier 58 improves the signal-to-noise ratio of the signal. The detector system 18 may also include a pile-up rejector 60 and an analog to digital converter (ADC) 62. A pulser control and separation logic module 32 may be connected between the ADC 62 and a multichannel analyzer (MCA) memory system 64. The pulser control and separation logic module 32 provides the dual functions of triggering the dual amplitude pulse generator 10 to produce the output signal 12 and subsequently removes the pulse events from the data signal for storage in the MCA memory system 64. More specifically, signal 30 produced by the pulser control and separation logic module 32 comprises two signal portions that are used by the dual amplitude pulse generator 10: An MSP (most significant pulse) signal portion and an LSP (least significant pulse) signal portion. See FIG. 4. The MSP and LSP signal portions are fed into the optical coupler 24 and emerge as the first and second trigger signals 42 and 44, both of which comprise the trigger signal 34.

The current signal 36 produced by the current source 22 comprises a high current signal 46 and a low current signal 48. These two signals 46 and 48 are fed into the gate circuit 20 which connects each current signal 46 and 48 to the output terminal 38 in an alternating manner to produce the high and low amplitude pulses 14 and 16 comprising the dual amplitude output signal 12. More specifically, the first trigger signal 42 causes the gate circuit 20 to alternately connect and disconnect the high current signal 46 to the output terminal 38, whereas the second trigger signal 44 causes the gate circuit 20 to alternately connect and disconnect the low current signal 48 to the output terminal 38. Since the first and second trigger signals 42 and 44 are produced in an alternating manner, the result is the dual amplitude output signal 12 which comprises the alternating high and low amplitude pulses 14 and 18. The output signal 12 may then be injected into the pre-amplifier 56 of detector 18.

A significant advantage of the dual amplitude pulse generator 10 according to the present invention is that it has a low power consumption, therefore allowing it to be used in portable detectors or in other applications wherein power consumption is an important consideration. The dual amplitude pulse generator is also extremely stable over a wide range of temperatures, thereby making it ideal for use in field conditions (as opposed to laboratory conditions) wherein substantial temperature variations are common. Having briefly described the dual amplitude pulse generator 10 according to the present invention, as well as some if its more significant features and advantages, the preferred embodiments of the dual amplitude pulse generator 10 will now be described in detail. However, before proceeding with the description it should be noted that while the dual amplitude pulse generator 10 is shown and described herein as it could be used to inject pulses into one particular type of gamma ray detector and processing system, it is not limited to use with any particular detector and processing system. Indeed, the dual amplitude pulse generator 10 according to the present invention could be used in any of a wide variety of applications requiring a low power consuming, temperature stable pulse generator.

Referring back now to FIG. 1, the dual amplitude pulse generator 10 may comprise a gate circuit 20, a current source 22, and an optical coupler 24. Optical coupler 24 electrically isolates the dual amplitude pulse generator 10 from the other components of the gamma ray detector system 18. Essentially, the optical coupler 24 is connected to the input terminal 40 and receives an input signal 30 from an appropriate signal source such as, for example, the pulser control and separation logic module 32 associated with the gamma ray detector system 18. See FIG. 3. The optical coupler 24 produces a trigger signal 34 which controls the operation of the gate circuit 20. A current source 22 connected to the gate circuit 20 produces a current signal 36 which is connected to the output terminal 38 by the gate circuit 20 in accordance with the trigger signal 34. As was mentioned above, the dual amplitude pulse generator circuit 10 may also include a pulse ratio selection circuit 26 connected to the current source 22. The pulse ratio selection circuit may be used to change the ratio of the high and low amplitude pulses 14 and 16 comprising the output signal 12. A gain adjusting circuit 28 may be utilized to adjust the amplitudes of the high and low amplitude pulses 14 and 16, but without changing the ratio between the high and low pulses 14 and 16.

As was briefly described above, one preferred embodiment the dual amplitude pulse generator 10 produces an output signal 12 comprising a high amplitude pulse 14 and a low amplitude pulse 16, since such high and low amplitude pulses are generally preferable for use with radiation detectors of the type shown and described herein. However, the dual amplitude pulse generator 10 may also be used to generate an output signal 12 comprising pulses having the same amplitude. Consequently the present invention should not be regarded as limited to applications requiring an output signal 12 having high and low amplitude pulses 14 and 16.

In accordance with its use to produce high and low amplitude pulses 14 and 16, one embodiment of the dual amplitude pulse generator 10 includes dual circuit portions in each of the gate 20, current source 22, and optical coupler circuits 24, as will be described in greater detail below. Also, the various signals 30, 34, and 36 each comprise two portions which correspond to the high and low amplitude pulses 14 and 16. That is, the input signal 30 produced by the pulser control and separation logic module 32 (FIG. 3) comprises two signal portions: The MSP (most significant pulse) signal portion and the LSP (least significant pulse) signal portion. See FIG. 4. The trigger signal 34 produced by the optical coupler 24 also comprises two separate trigger signal portions, a first trigger signal 42 and a second trigger signal 44. Similarly, the current signal 36 produced by the current source 22 comprises a high current signal 46 and a low current signal 48. The remainder of the description will refer to the individual portions of each of the signals just described.

The dual amplitude pulse generator 10 may be used with a gamma ray detector system 18 of the type shown and described in U.S. Pat. No. 4,968,889 and the following description is directed to that application. Referring now to FIG. 3, the gamma ray detector system 18 may comprise a detector 50 for detecting a high energy photon 52, such as a gamma ray or an x-ray, produced by a source 54. The output signal produced by the detector 50 is then processed by pre-amplifier 56 and linear amplifier 58 before being directed to a pile-up rejector 60. The ADC (i.e., analog to digital converter) 62 converts the analog signal to a digital signal which is then processed by pulser control and separation logic module 32. The resulting processed signal is then directed to the MCA memory system 64 where it is stored for later use.

The pulser control and separation module 32 produces an output signal 30 comprising the MSP signal portion and the LSP signal portion which portions are used by the optical coupler 24 to produce the first and second trigger signals 42 and 44, respectively. See FIG. 4. In one preferred embodiment, the MSP and LSP signal portions comprise TTL signals of a periodic nature (e.g., a 50 Hz square wave signal). Each signal is offset from the other (i.e., phase-shifted) so that the MSP signal results in the production of the high amplitude pulse 14 whereas the LSP signal results in the production of the low amplitude pulse 16. See FIG. 2.

Referring now to FIG. 4, it is preferred, but not required, that an optical coupler 24 (FIG. 1) be used to electrically isolate the dual amplitude pulse generator 10 from the other components of the gamma ray detector system 18. In one embodiment, the optical coupler 24 comprises two circuit portions, the first of which produces the first trigger signal 42 in response to the MSP signal and the second of which produces the second trigger signal 44 in response to the LSP signal. More specifically, the first circuit portion of optical coupler 24 may comprise a first optical isolator circuit 66, along with various associated components. The MSP signal portion is fed into the input of the first optical isolator circuit 66 via resistor 68 and emerges from the first optical isolator circuit 66 as the first trigger signal 42.

The first trigger signal 42 may comprise a periodic square wave signal having a frequency and duration commensurate with the particular application. For example, in one preferred embodiment the first trigger signal 42 may have a frequency of about 50 Hz and a duration of about 40 microseconds ($\mu s$).

The various components that comprise the first circuit portion of optical coupler 24 (i.e., the circuit portion that produces the first trigger signal 42 from the MSP signal) may comprise any of a wide range of types and values depending on the desired application and the particular circuit design. In one preferred embodiment, optical isolator circuit 66 may comprise a type OU500, although other types of optical isolators may also be used. Resistor 68 may comprise a resistor having a value of 121 ohms ($\Omega$).

The second circuit portion of optical coupler 24 is essentially identical to the first circuit portion just described, except that it produces the second trigger signal 44 based on the LSP input signal. The second circuit portion of optical coupler 24 comprises a second optical isolator circuit 66' and associated components. The LSP input signal is fed into the second optical isolator circuit 66' via resistor 68' and emerges from the second optical isolator circuit 66' as the second trigger signal 44.

The second trigger signal 44 may comprise a periodic square wave signal having a frequency and duration commensurate with the particular application. For example, in one preferred embodiment the second trigger signal 44 may have a frequency of about 50 Hz and a duration of about 40 μs. The values and types of components comprising the second circuit portion of optical coupler 24 may be identical to those already specified for the first circuit portion.

The current source 22 may also comprise a pair of circuit portions, each of which operates as a separate current source. That is, the first current source circuit portion provides the high current signal 46 whereas the second circuit portion provides the low current signal 48. The first circuit portion of current source 22 may comprise an operational amplifier 78 which, in conjunction with FET 84, operates as a current source to produce the high current signal 46. The inverting (−) input of operational amplifier 78 is connected to a temperature-stabilized voltage source 80 via resistor 81. The non-inverting (+) input of operational amplifier 78 may be connected to ground via resistor 82 and to the voltage source 80 via resistor 83. The output of operational amplifier 78 may be connected to the gate terminal G of the field effect transistor (FET) 84. The drain terminal D of FET 84 is connected to the gate circuit 20 whereas the source terminal S is connected to the inverting (−) input of operational amplifier 78.

In one preferred embodiment, the operational amplifier 78 comprises a dual supply operational amplifier and may be connected across the positive and negative terminals (e.g., +12 volts and −12 volts) of a suitable split power supply (not shown) via resistors 85 and 86. The supply inputs may also be connected to ground via filter capacitors 87 and 88. The operational amplifier 78 may comprise any of a wide variety of precision operational amplifiers that are readily commercially available. In one preferred embodiment, operational amplifier 78 may comprise a type ADOP-07AH. FET 84 may comprise a type 2N4416, although other types may also be used. Resistors 81, 82, 83, 85, and 86 may have respective resistance values of 1 kΩ, 2 kΩ, 2 kΩ, 100Ω, and 100Ω. Capacitors 87 and 88 may comprise 0.1 μF capacitors.

The high current signal 46 comprises a continuous current flow and may have any of a wide range of magnitudes depending on the particular application. By way of example, in one preferred embodiment the high current signal 46 comprises a continuous current flow of about 3 milliamperes (ma).

The second circuit portion of current source 22 that produces the low current signal 48 is similar to the first circuit portion just described, except that the values of resistors 81', 82', and 83' differ from those of resistors 81, 82, and 83. These different values cause the operational amplifier 78' to produce a lower current output signal 48. The second circuit portion also includes an additional resistor 89' to allow the magnitude of the low current signal 48 to be changed, thereby allowing the pulse ratio to be changed, as will be described in greater detail below.

The second circuit portion of current source 22 may comprise a second operational amplifier 78' having its inverting (−) input connected to the voltage source 80 via resistor 81'. The non-inverting (+) input is connected to ground via resistor 82' and to the voltage source 80 via resistor 83'. One end of an additional resistor 89' is connected to the inverting (−) input whereas the other end is connected to terminal 91. A second terminal 92 is connected to the voltage source 80 and resistor 81' in the manner shown. The current output of operational amplifier 78' may be changed by connecting terminal 91 to terminal 92 as will be described in further detail below. The output of operational amplifier 78' is connected to the gate terminal G of a second field effect transistor (FET) 84'. The drain terminal D of FET 84' is connected to the gate circuit 20, whereas the source terminal S is connected to the inverting (−) input of operational amplifier 78'. Operational amplifier 78' may be connected across the positive and negative terminals (e.g., +12 volts and −12 volts) of a suitable split power supply (not shown) via resistors 85' and 86.' The power input terminals may also be connected to ground via filter capacitors 87' and 88' in the manner shown.

As was the case for the first operational amplifier 78, the second operational amplifier 78' may comprise a precision operational amplifier, such as type ADOP-07AH, whereas FET 84' may comprise a type 2N4416, although other types of devices could also be used. Resistors 85' and 86' and capacitors 87' and 88' may have the same values as resistors 85 and 86 and capacitors 87 and 88 set forth above. However, resistors 81', 82', and 83' have different values than resistors 81, 82, and 83 to allow the second operational amplifier 78' to produce a lower current output signal 48. More specifically, resistors 81', 82', and 83', may have respective resistances of 16.6 kΩ, 20 kΩ, and 20 kΩ. Resistor 89' may have a value of about 25 kΩ. Thus, when terminals 91 and 92 are not connected, the ratio of the high and low current signals 46 and 48 will be about 10:1, whereas the current ratio will increase to about 50:1 when terminals 91 and 92 are connected.

The low current signal 48 comprises a continuous current flow and may have any of a wide range of magnitudes depending on the particular application. By way of example, in one preferred embodiment the low current signal 48 comprises a continuous current flow of about 0.3 milliamperes (ma) at the low ratio (i.e., 10:1) and a current flow of about 0.06 ma at the high ratio (i.e., 50:1).

The temperature-compensated voltage source 80 is important in assuring the stability of the output signal 12 of pulse generator 10. That is, if the voltage provided by voltage source 80 varies, then so will the amplitudes 11 and 13 of the respective high and low amplitude pulses 14 and 16 of the output signal 12. With this consideration in mind, one preferred embodiment of the invention utilizes as the voltage source 80 a zener-type (i.e., two terminal) IC voltage reference, such as type LM299AH, which provides an output voltage of about 6.95 volts. This voltage reference includes an internal heater and associated sensor (not shown) which provide excellent thermal stability with low power consumption and rapid warm-up time. In one preferred embodiment, the voltage source 80 is mounted at a remote location, away from the rest of the circuit.

The gate circuit 20 may also comprise a pair of circuit portions to selectively connect to the output terminal 38 the high and low current signals 46 and 48. The first circuit portion of gate circuit 20 includes a transistor 70. The base of transistor 70 is connected to the first optical isolator 66 via a resistor 72. The collector and emitter of transistor 70 are connected between the negative and positive terminals (e.g., −12 volts and +12 volts) of a split power supply (not shown) via resistors 71, 73 and 74. The base of transistor 70 is also connected to the node between resistors 73 and 74 via resistor 75. A capacitor 76 is connected between resistor 75 and ground in the manner shown in FIG. 4. The first trigger signal 42 is applied to the base of transistor 70.

Transistor 70 may comprise a PNP transistor such as type 2N3906, although other types could also be used. Resistors 71, 72, 73, 74, and 75 may comprise, respectively, resistors having values of 12 kilo-ohms (kΩ), 1 kΩ, 1 kΩ, 100Ω, and 3.92 kΩ. Capacitor 76 may comprise a 0.1 microfarad (μF) capacitor.

The second circuit portion of gate circuit 20 is similar to the first circuit portion just described and may comprise a transistor 70', the base of which is connected to the second optical isolator 66' by a resistor 72'. The collector and emitter of transistor 70' may be connected across the negative and positive terminals of the split power supply (not shown) via resistors 71', 73', and 74' in the manner shown in FIG. 4. The base of transistor 70' may also be connected to the node between resistors 73' and 74' by a resistor 75'. A capacitor 76' may be connected between resistor 75' and ground in the manner shown. The second trigger signal 44 from the second optical isolator circuit 66' is applied to the base of transistor 70'.

The values and types of components comprising the second circuit portion of the gate circuit 20 may be identical to those already specified for the first circuit portion, except that resistor 73' may have a resistance of 2 kΩ instead of 1 kΩ.

The gate circuit 20 may also include a diode network having two circuit portions. More specifically, the first or upper portion of the diode network connects and disconnects the high current signal 46 to the output terminal 38 in response to the first trigger signal 42 applied to the base of transistor 70. The second or lower portion of the diode network connects and disconnects the low current signal 48 to the output terminal in response to the second trigger signal 44 applied to the base of transistor 70'.

The upper diode network comprises a first pair of diodes 57, 59 that are connected in series between the collector of transistor 70 and ground. The collector of transistor 70 is also connected to a second pair of series-connected diodes 61 and 63. A third pair of series-connected diodes 65 and 67 are connected between the second pair of series-connected diodes 61 and 63 and the output terminal 38. The third pair of series-connected diodes 65 and 67 are connected to the second pair of series-connected diodes 61 and 63 so that the cathode of diode 63 is connected to the cathode of diode 65. The drain D of FET 84 is connected to the cathodes of diodes 63 and 65 in the manner shown in FIG. 4.

A biasing network 69 connected to the anode of diode 61 holds the second series-connected diode pair comprising diodes 61 and 63 on the threshold of conduction. This allows the first trigger signal 42 produced at the collector of transistor 70 to turn-off (i.e., place in the non-conducting state) the second series connected diode pair 61, 63, which in turn allows current to flow from the output terminal 38 through the third series-connected diode pair 65, 67 and FET 84. When transistor 70 turns off, the second series-connected diode pair 61, 63 conducts, which removes the high current signal 46 from the output terminal 38.

In one preferred embodiment, diodes 57, 59, 63, 65 and 94 may comprise type 1N3864, although other types could also be used. Diodes 61 and 67 may comprise types 2N4416, although other types could also be used.

The biasing network may comprise a resistor 77 and a zener diode 79 connected in series between a negative voltage source (e.g., −12 volts) and ground. A filter capacitor 93 may be connected across zener diode 79. A diode is connected between the anode of zener diode 79 and the anode of diode 61. In one preferred embodiment, zener diode 79 comprises a 3 volt zener diode, such as a type 1N4728, although other types could also be used. Resistor 77 may comprise a 1 kΩ resistor and capacitor 93 may comprise a 1 μF capacitor.

The second or lower portion of the diode network comprising gate circuit 20 is essentially identical to the first or upper portion just described. That is, the lower diode network comprises a fourth pair of diodes 57', 59' that are connected in series between the collector of transistor 70' and ground. The collector of transistor 70' is also connected to a fifth pair of series-connected diodes 61' and 63'. A sixth pair of series-connected diodes 65' and 67' are connected between the fifth pair of series-connected diodes 61' and 63' and the output terminal 38. The sixth pair of series-connected diodes 65' and 67' are connected to the fifth pair of series-connected diodes 61' and 63' so that the cathode of diode 63' is connected to the cathode of diode 65'. The drain D of FET 84' is connected to the cathodes of diodes 63' and 65' in the manner shown. A diode 94' connects the anode of diode 61' to the biasing network 69.

In one preferred embodiment, diodes 57', 59', 63', 65' and 94' may comprise type 1N3864, although other types could also be used. Diodes 61' and 67' may comprise types 2N4416, although other types could also be used.

The gain adjustment circuit 28 may comprise a voltage divider network connected between output terminal 38 and ground. In one preferred embodiment, the voltage divider network of gain adjustment circuit 28 comprises four resistors 95, 96, 97, and 98. Supplemental output terminals 38', 38" and 38'" may be connected to resistors 95, 96, 97, and 98 in the manner shown to provide variable output voltages. The various resistors 95, 96, 97, and 98 comprising the gain adjustment circuit 28 may comprise any of a wide range of values depending on the desired voltage outputs that are to be provided. In one preferred embodiment, each of the resistors 95, 96, 97, and 98 may have a value of about 20 ohms. Finally, the various resistors 95, 96, 97, and 98 comprising the gain adjustment circuit 28 may be located at a remote position from the rest of the circuit. Alternatively, Ii of course, the various resistors of the gain adjustment circuit could also be provided at the same location.

Figure 2:
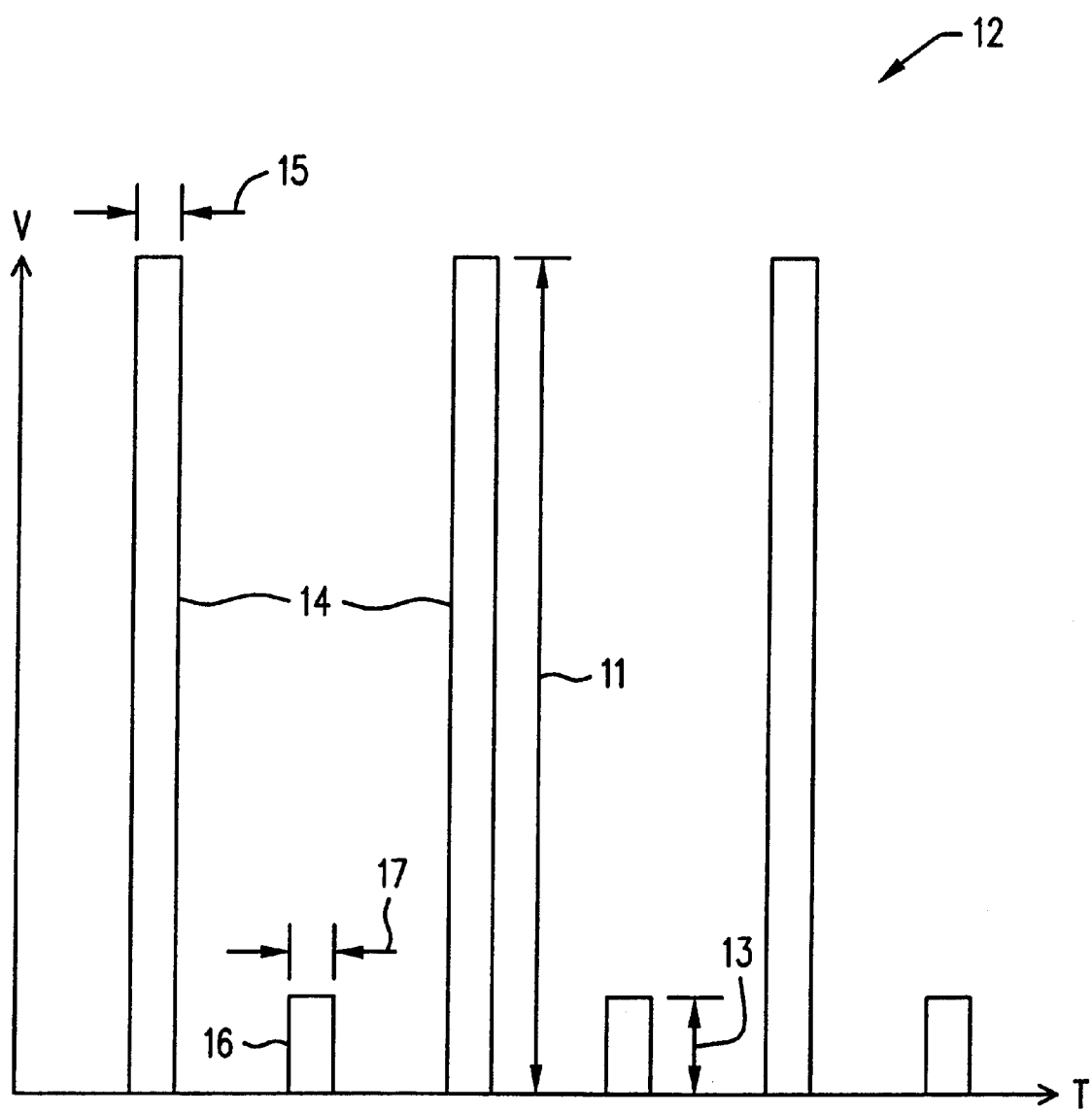
FIG. 2 is a graphical representation of the output signal produced by the dual amplitude pulse generator showing the alternating high and low amplitude pulses.

The dual amplitude pulse generator 10 may be operated as follows to produce the dual amplitude output signal 12 having alternating high and low amplitude pulses 14 and 16 (FIG. 2). However, before proceeding with the description it should be noted that the high and low amplitude pulses 14 and 16 may be produced at any of a wide range of frequencies and may have any of a wide range of durations 15 and 17, respectively, depending on the particular application. Consequently, the present invention should not be regarded as limited to high and low amplitudes having any particular frequencies or durations. By way of example, in one preferred embodiment the high amplitude pulse 14 is produced at a frequency of about 50 Hz and has a duration 15 of about 40 μs. The low amplitude pulse 16 may also be produced at a frequency of about 50 Hz and may have a duration 17 of about 40 μs.

Proceeding now with the description, consider, for example, an application wherein the dual amplitude pulse generator 10 is connected to a radiation detector 18, such as the type shown in FIG. 3 and disclosed in detail in U.S. Pat. No. 4,968,889. Essentially, the radiation detector 18 may comprise a detector 50 that is responsive to a gamma ray 52 produced by a source 54. The detector 50 produces an output signal which is amplified by a pre-amplifier 56 and a linear amplifier 58. The amplified signal may then be passed on to a pile-up rejector 60 and an analog to digital converter (ADC) 62. Alternatively, the amplified signal may be passed directly to the ADC 62. A pulser control and separation logic module 32 may be connected between the ADC 62 and the multichannel analyzer (MCA) memory system 64. The pulser control and separation logic module 32 generates the signal 30 used by the dual amplitude pulse generator 10 to produce the output signal 12. The pulser control and separation logic module 32 also removes the pulse events from the data signal and stores them in the MCA memory system 64 in locations forbidden to gamma-ray and x-ray events.

The signal 30 produced by the pulser control and separation logic module 32 comprises two signal portions: The MSP (most significant pulse) signal portion and the LSP (least significant pulse) signal portion. The MSP and LSP signal portions are used by the optical coupler 24 to produce the first and second trigger signals 42 and 44. The high and low current signals 46 and 48 produced by the current source 22 are fed into the gate circuit 20 which selectively connects each current signal 46 and 48 to the output terminal 38 in an alternating manner to produce the high and low amplitude pulses 14 and 16 comprising the dual amplitude output signal 12. More specifically, the first trigger signal 42 produced by the optical coupler 24 causes the gate circuit 20 to connect the high current signal 46 to the output terminal 38, whereas the second trigger signal 44 causes the gate circuit 20 to connect the low current signal 48 to the output terminal 38. Since the first and second trigger signals 42 and 44 are produced in an alternating manner as a result of the alternating nature of the MSP and LSP input signals from the pulser control and separation logic module 32, the result is the dual amplitude output signal 12 comprising alternating high and low amplitude pulses 14 and 18. The output signal 12 may then be injected into the pre-amplifier 56 of detector 18.

It is contemplated that the inventive concepts herein described may be variously otherwise embodied and it is intended that the appended claims be construed to include alternative embodiments of the invention except insofar as limited by the prior art.

We claim:

1. A pulsing circuit for producing an output signal having a high energy amplitude pulse and a low amplitude pulse for use with radiation detection systems, comprising:

a current source for providing a high current signal and a low current signal;

a gate circuit operatively connected with said current source, said gate circuit including a trigger signal input from an optical coupler operatively connected with a radiation detector system and a pulse output, the trigger signal input being responsive to a first trigger signal and a second trigger signal, the first trigger signal causing said gate circuit to connect the high current signal to the pulse output and the second trigger signal causing said gate circuit to connect the low current signal to the pulse output, wherein the high current signal results in the high amplitude pulse and wherein the low current signal results in the low amplitude pulse.

2. The pulsing circuit of claim 1, further comprising a pulse ratio selection circuit operatively connected with said current source for adjusting a ratio of a magnitude of the low current signal and a magnitude of the high current signal.

3. The pulsing circuit of claim 2, further comprising a gain adjustment circuit operatively connected with said gate circuit for adjusting a magnitude of the output signal.

4. The pulsing circuit of claim 3, wherein said current source comprises:

a first operational amplifier connected as a current source for producing the high current signal;

a second operational amplifier connected as a current source for producing the low current signal; and a voltage source operatively connected with said first and second operational amplifiers for providing said first and second operational amplifier with a substantially constant reference voltage.

5. The pulsing circuit of claim 4, wherein said gain adjustment circuit comprises a voltage divider network connected to the pulse output of said gate circuit.

6. The pulsing circuit of claim 5, wherein said trigger signal input of said gate circuit comprises a first input terminal for receiving the first trigger signal and a second input terminal for receiving the second trigger signal, wherein said gate circuit further comprises:

a first diode assembly connected to the first input terminal;

a second diode assembly connected between said first diode assembly and the pulse output of said gate circuit, said first and second diode assemblies also being connected to said first operational amplifier so that the high current signal is applied to a first node defined between said first and second diode assemblies;

a third diode assembly connected to the second input terminal;

a fourth diode assembly connected between said third diode assembly and the pulse output of said gate circuit, said third and fourth diode assemblies also being connected to said second operational amplifier so that the low current signal is applied to a second node defined between said third and fourth diode assemblies; and a bias voltage source connected to the first input terminal and the second input terminal.

7. The pulsing circuit of claim 6, further comprising:

a fifth diode assembly connected between the first input terminal and a ground node; and a sixth diode assembly connected between the second input terminal and the ground node.

8. The pulsing circuit of claim 7, wherein said first diode assembly comprises a first pair of diodes connected in series so that the anode of said first pair of diodes is connected to the first input terminal and wherein said second diode assembly comprises a second pair of diodes connected in series so that the anode of said second pair of diodes is connected to the pulse output of said gate circuit.

9. The pulsing circuit of claim 8, wherein said third diode assembly comprises a third pair of diodes connected in series so that the anode of said third pair of diodes is connected to the second input terminal and wherein said fourth diode assembly comprises a fourth pair of diodes connected in series so that the anode of said fourth pair of diodes is connected to the pulse output of said gate circuit.

10. The pulsing circuit of claim 9, wherein said fifth diode assembly comprises a fifth pair of diodes connected in series so that the anode of said fifth pair of diodes is connected to the first input terminal.

11. The pulsing circuit of claim 10, wherein said sixth diode assembly comprises a sixth pair of diodes connected in series so that the anode of said sixth pair of diodes is connected to the second input terminal.

12. The pulsing circuit of claim 11, wherein said pulse ratio selection circuit comprises means for changing the current output of said second operational amplifier, wherein said pulse ratio selection circuit changes the magnitude of the low current signal with respect to the magnitude of the high current signal.

13. The pulsing circuit of claim 12, further comprising a first amplifier connected to the first input terminal of said gate circuit for applying an amplified first trigger signal to said gate circuit and a second amplifier connected to the second input terminal of said gate circuit for applying an amplified second trigger signal to said gate circuit.

* * * * *